June 24, 1958

D. A. JENNY 2,840,496

SEMI-CONDUCTOR DEVICE

Filed Nov. 25, 1953

INVENTOR.
Dietrich A. Jenny

BY J. L. Whittaker
ATTORNEY

United States Patent Office 2,840,496

Patented June 24, 1958

2,840,496

SEMI-CONDUCTOR DEVICE

Dietrich A. Jenny, Princeton, N. J., assignor to Radio Corporation of America, a corporation of Delaware Application November 25, 1953, Serial No. 394,383

6 Claims. (Cl. 148—1.5)

This invention relates to improved semi-conductor materials, devices and methods of making them. More particularly, the invention relates to devices utilizing semi-conductive cadmium telluride, to methods of making n-type semi-conductive cadmium telluride and to methods of forming p-n rectifying barriers or junctions in bodies of p-type semi-conductive cadmium telluride.

Many different semi-conductor devices utilizing semi-conductive germanium and silicon are known. The operation of these devices is usually subject to relatively severe maximum temperature limitations. The temperature limitation of a typical device is determined primarily by the energy gap between the valence band and the conduction band of the semi-conductive material of the device. When the temperature of the device is increased to a point where thermal energy becomes sufficient to raise substantial numbers of electrons across the energy gap, the semi-conductive characteristics of the material are adversely affected. For example, the energy gap of germanium is about 0.7 electron volt and many devices utilizing germanium become inoperative above temperatures as low as 80° C.

Accordingly it is an object of the instant invention to provide improved semi-conductive materials.

Another object is to provide improved semi-conductive materials having relatively high energy gaps between their conduction and valence bands.

Another object is to provide improved semi-conductor devices operable at relatively high temperatures.

Another object is to provide improved semi-conductive cadmium telluride having n-type conductivity.

Another object is to provide within a body of p-type semi-conductive cadmium telluride a region of n-type conductivity and a p-n rectifying junction between said region and the remainder of the body.

Still another object is to provide a method of creating a p-n rectifying junction within a body of p-type semi-conductive cadmium telluride.

A still further object is to provide an improved method of forming an electrode fused to a body of semi-conductive cadmium telluride having a p-n rectifying junction associated therewith.

These and other objects may be accomplished by the practice of the instant invention according to which it has now been discovered that elements of the III*a* and the VII*a* columns of the periodic table yield n-type impurity centers when dispersed in semiconductive cadmium telluride. It has also been found that small bodies of these elements, or of alloys including substantial proportions of them, may be fused to p-type semi-conductive cadmium telluride to form electrodes having p-n rectifying junctions. The energy gap of cadmium telluride is about 1.45 electron volts, and devices based on cadmium telluride are operable at relatively high temperatures.

The invention will be described in greater detail in connection with the drawing of which:

Similar reference characters are applied to similar elements throughout the drawing.

Figure 1:
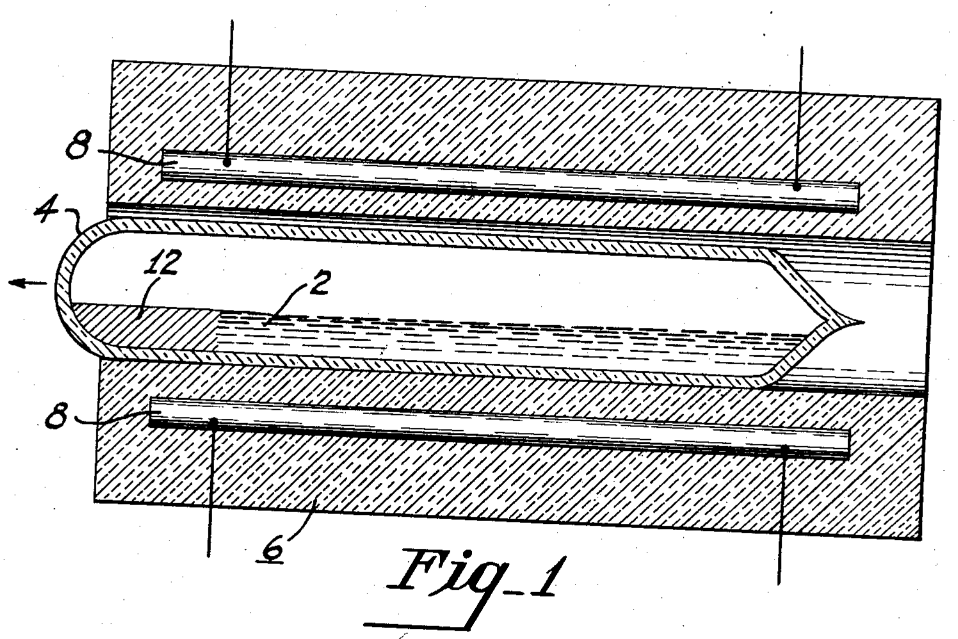
Figure 1 is a partially schematic, elevational cross-sectional view of apparatus suitable for use in producing semi-conductive cadmium telluride according to the instant invention.

One feature of the instant invention is the production of n-type semi-conductive cadmium telluride, which may be conveniently made utilizing the apparatus shown in Figure 1. A quantity 2, for example, about 10 grams of relatively pure cadmium telluride is placed within a refractory tube 4 which may be of quartz. In place of cadmium telluride equivalent quantities of cadmium and tellurium in stoichiometric proportions may be used. About 0.1% by weight of an impurity-yielding material is placed in the tube with the cadmium telluride. This material may be any of the elements of the III*a* or VII*a* groups of the periodic table according to Mendeleeff. (The III*a* group includes boron, aluminum, gallium, indium and thallium. The VII*a* group includes the halogens.) Conveniently, indium may be used.

Generally, any quantity in excess of $10^{-6}$ atomic percent of one or more of the elements specified is sufficient to impart n-type conductivity to semi-conductive cadmium telluride. It is preferred not to employ relatively large quantities, that is, over a few percent, of any of the impurity-yielding materials since the semi-conductive character of the cadmium telluride may be adversely affected. If, for example, too much indium is added a ternary compound of cadmium, indium and tellurium may be formed, or an alloy of cadmium and indium telluride.

The tube is evacuated and sealed off to prevent contamination of the material and loss of any of its constituents by vaporization. The tube is placed within a furnace 6 which may be heated by any convenient means such as the electric resistance elements 8. Initially the tube is centered longitudinally within the furnace and is heated to about 1100° C. completely to melt the cadmium telluride. The material is maintained in a molten state for at least a few minutes to insure complete intermixture of the cadmium, tellurium and the impurity-yielding material.

The cadmium telluride is then frozen progressively from one end of the tube to the other by a gradient freezing process. This may be accomplished by slowly withdrawing the quartz tube from the furnace at a controlled rate. Preferably, however, to produce a more uniform ingot the tube is moved a short distance within the furnace to an asymmetrical position with respect to the heating elements. The effect of this change of position, to approximately the location illustrated, is to provide a temperature gradient along the length of the charge. One end 12 of the charge is removed from the direct heating effect of the resistance elements and is maintained at a slightly lower temperature than the remainder of the charge. The temperature of the furnace is gradually reduced to freeze the charge in a progressive longitudinal manner.

It is desirable during the freezing process to maintain the entire charge as close to the melting point as possible. The temperature gradient is preferably made barely sufficient to insure progressive freezing of the charge from one end to the other as the over-all furnace temperature is reduced. If a relatively steep temperature gradient is provided, the uniformity of the frozen ingot may be affected by preferential condensation of vapors at the low temperature end of the tube.

This process is called gradient freezing and may be accomplished by any known apparatus. Gradient freezing assists in producing a cadmium telluride ingot a major portion of which has a relatively high degree of purity. Many impurities and also a substantial proportion of the impurity-yielding material initially added to the melt are driven by the gradient freezing process to the last-frozen portion of the ingot. This effect depends of course upon the segregation characteristics of the system.

A cadmium telluride ingot thus produced comprises several relatively large crystallites, some of which may be as large as about ⅓ cubic centimeter. Substantially all of the ingot exhibits n-type semi-conductivity due primarily to the impurity centers introduced into the material by the element of column IIIa or VIIa. This is unexpected and surprising since in previously known semi-conductive materials such as germanium, impurity elements of the IIIa column are known to yield p-type conductivity. The apparently opposite effect in cadmium telluride is explainable on a basis of atomic substitutions in the crystal structure. It is not intended to limit the scope of the invention by this theory. It is believed, however, that the elements of column IIIa substitute themselves in the crystal lattice of cadmium telluride more readily in the place of cadmium than in the place of tellurium. Since cadmium has two valence electrons and the elements of the IIIa group have three valence electrons, one electron of each impurity atom is not bound in the crystal lattice but is available for conduction. In the case of the halogens it is believed that these are substituted in the place of tellurium in the crystal lattice, again with the freeing of an excess electron.

From a chemical point of view, the materials of the invention may be considered to be cadmium telluride containing traces of a group IIIa telluride or of a cadmium halide. This analysis is believed quite proper, but since the group IIIa or VIIa element atoms are primarily determinative of the conductivity type of the material, it is preferred to consider these atoms alone.

Any of the halogens may be dispersed in cadmium telluride to produce n-type semi-conductive materials. One method of producing semi-conductive cadmium telluride having halogen atoms dispersed therein is generally similar to the method of making cadmium selenide described in the co-pending application of Richard H. Bube and Soren M. Thomsen, Serial No. 349,661, filed April 20, 1953, now abandoned, and assigned to the same assignee as the instant application. According to this method, breifly, cadmium, tellurium and a halogen or a halide, all in gaseous states are intermixed in a closed vessel. Any one of the halogens is suitable, or a mixture of more than one and, alternatively, a decomposable halide may be used such as hydrogen or methyl chloride or iodide. The temperature of the mixture is controlled so that as the gases interact solid crystals of cadmium telluride are formed directly from the gases. These crystals include dispersed halogen atoms which determine the conductivity type of the crystals.

A preferred method of introducing halogen impurity centers into cadmium telluride comprises melting cadmium telluride together with a quantity of a cadmium halide and freezing the mixture thus formed. This method is generally similar to the method heretofore described in connection with doping cadmium telluride with indium. A cadmium halide such as cadmium iodide is utilized in place of indium, and the process may be carried out in an exactly similar manner.

By the use of a cadmium halide relatively large concentrations of halogen atoms may be induced into cadmium telluride, and semi-conductive material of relatively low resistivity may be formed. For example, when about 10 grams of cadmium telluride is melted with about 0.001 gram of cadmium iodide and refrozen as heretofore described the resulting material has a resistivity of less than about 10 ohm cm.

N-type semi-conductive cadmium telluride may be produced according to the invention having about $10^{14}$ to $10^{18}$ impurity centers per cubic centimeter of volume. The particular concentration desired will depend upon the resistivity desired in the material, which in turn depends to a large extent upon the particular use to which the material is to be put. For certain devices, for example, such as those designed to operate at relatively high frequencies it may be desirable to provide semi-conductive cadmium telluride of relatively low resistivity. Other devices may require relatively high resistivity material. The resistivity varies inversely with the concentration of impurity centers. The concentration of impurity centers may be controlled by varying the amount of impurity-yielding material incorporated in the melt in much the same manner as in the production of other semi-conductive materials such as germanium.

Crystallites may be cut from selected portions of an ingot, produced as described heretofore, to provide semi-conductive wafers consisting essentially of single crystal structures. Such wafers, having n-type semi-conductivity, may be used to make semi-conductive devices such as those described in my co-pending application, Serial No. 394,391, filed concurrently herewith.

The n-type impurity-yielding materials described heretofore may be utilized as electrode materials in conjunction with p-type semi-conductive cadmium telluride to form semi-conductor devices having p-n rectifying junctions. These materials, especially those of column IIIa, which are solid or liquid at room temperature, may be utilized with cadmium telluride to form alloy junction devices such as, for example, the device shown in Figure 3.

Figure 2:
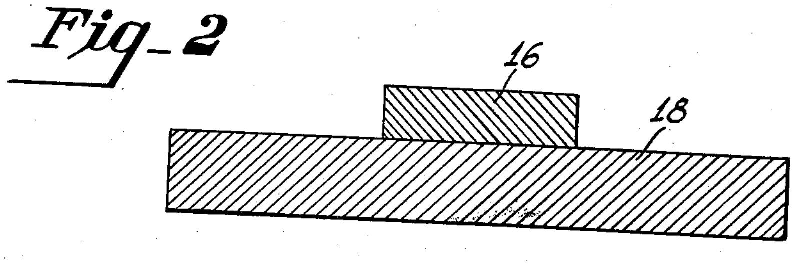
Figures 2 and 3 are schematic, elevational, cross-sectional views of a wafer of semi-conductive cadmium telluride illustrating successive steps in the production of a semi-conductor device according to the invention.
Figure 3:
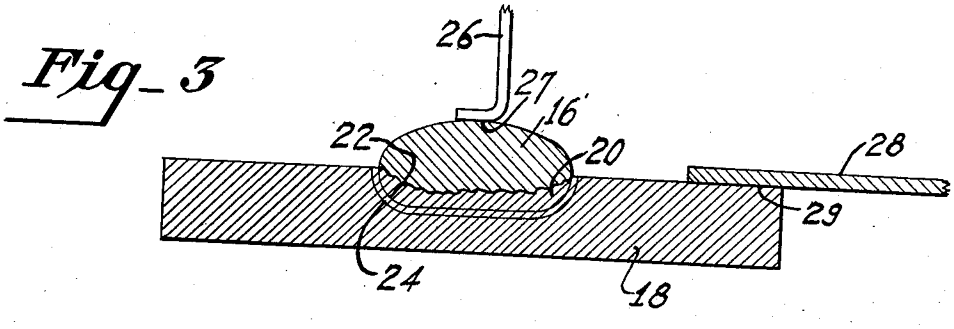

As shown in Figures 2 and 3, a pellet 16 of an impurity-yielding material selected from group IIIa, for example, indium is placed on the surface of a wafer 18 of p-type semi-conductive cadmium telluride. The wafer is preferably a single crystal and may be of any convenient size such as about ⅛" x ⅛" x .01" thick. The pellet may be of any size smaller than the wafer. It may conveniently be made in the form of a disc about .05" in diameter and .005" thick. The wafer and pellet are heated together in a non-oxidizing atmosphere at about 400°–600° C. for about five minutes to alloy the pellet into the wafer and to form the device shown in Figure 3.

The device is generally similar in constructional details to corresponding alloy type devices made of other semi-conductive materials. It consists of the wafer 18 of p-type semi-conductive cadmium telluride and an indium electrode 16' formed from the pellet 16 and fused to the surface of the wafer. The farthest point of penetration of the pellet into the wafer is called the alloy front and is shown by the line 22. During the alloy process a portion of the wafer is dissolved into the molten pellet and during cooling a recrystallized region 20 rich in indium and an integral part of the wafer is formed adjacent the alloy front. This region has n-type conductivity. A p-n rectifying junction 24 is formed adjacent the alloy front. Electrical leads 26 and 28 may be attached by non-rectifying solder connections 27 and 29 to the electrode and the wafer respectively. The device may be etched, mounted and potted according to the conventional techniques utilized in conjunction with germanium semi-conductor devices.

Similar devices may be formed utilizing pellets of other elements of the boron group, mixtures of these elements, or alloys comprising significant proportions of them.

There have thus been described improved semi-conductive materials, devices utilizing these materials, and improved methods of making both the materials and the devices.

What is claimed is:

1. A semi-conductor device comprising a body of semi-conductive cadmium telluride having an n-type semi-conductive region, the conductivity of said region being primarily determined by the presence in said region of impurity centers consisting of atoms of at least one element selected from the IIIa and the VIIa columns of the periodic table according to Mendeleeff.

2. A semi-conductor device according to claim 1 in which said impurity centers consist essentially of indium atoms.

3. In a semi-conductor device comprising a body of semi-conductive material having a region of p-type semi-conductivity, a region of n-type semi-conductivity, and a p-n rectifying barrier intermediate said regions the improvement consisting of said materials being cadmium telluride.

4. In an alloy junction type semi-conductor device including a body of p-type semi-conductive material, a fused electrode alloyed to the surface of said body and a p-n rectifying junction disposed within said body adjacent said electrode, the improvement consisting of said materials being cadminum telluride and said electrode comprising a material which imparts n-type conductivity to semi-conductive cadmium telluride when dispersed therein.

5. An n-type semi-conductive material consisting essentially of cadmium telluride and having impurity centers dispersed throughout its mass, said impurity centers consisting essentially of at least $10^{-6}$ atomic percent but not more than $10^{18}$ atoms per cc. of volume of an element selected from the IIIa and VIIa columns of the periodic table according to Mendeleeff.

6. A material according to claim 5 in which said selected element is indium.

References Cited in the file of this patent

UNITED STATES PATENTS

| | | |
|---|---|---|
| 1,751,361 | Ruben | Mar. 18, 1930 |
| 2,208,455 | Glaser et al. | July 16, 1950 |
| 2,582,850 | Rose | Jan. 15, 1952 |
| 2,615,060 | Marinace et al. | Oct. 21, 1952 |
| 2,629,672 | Sparks | Feb. 24, 1953 |
| 2,644,852 | Dunlap | July 7, 1953 |
| 2,697,052 | Dacey et al. | Dec. 14, 1954 |